(12) United States Patent
Crippa

(10) Patent No.: US 12,105,118 B2
(45) Date of Patent: Oct. 1, 2024

(54) TESTING HEAD WITH AN IMPROVED CONTACT BETWEEN CONTACT PROBES AND GUIDE HOLES

(71) Applicant: TECHNOPROBE S.P.A., Cernusco Lombardone (IT)

(72) Inventor: Roberto Crippa, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 182 days.

(21) Appl. No.: 17/783,452

(22) PCT Filed: Dec. 18, 2020

(86) PCT No.: PCT/EP2020/086962
§ 371 (c)(1),
(2) Date: Jun. 8, 2022

(87) PCT Pub. No.: WO2021/123120
PCT Pub. Date: Jun. 24, 2021

(65) Prior Publication Data
US 2023/0029150 A1    Jan. 26, 2023

(30) Foreign Application Priority Data
Dec. 20, 2019    (IT) .................. 102019000024946

(51) Int. Cl.
*G01R 1/073*    (2006.01)
(52) U.S. Cl.
CPC .................... *G01R 1/073* (2013.01)
(58) Field of Classification Search
CPC ............... G01R 1/073; G01R 1/06738; G01R 1/07357; G01R 1/07314; G01R 1/06716; G01R 1/06761
(Continued)

(56) References Cited
U.S. PATENT DOCUMENTS

2002/0048954 A1*  4/2002  Zhou ................. G01R 1/07314
                                                              438/689
2012/0295490 A1*  11/2012  Schneider ............. H01R 12/91
                                                              29/423
(Continued)

FOREIGN PATENT DOCUMENTS

CN    109507456 A    3/2019
EP       2924446 A1 *   9/2015    ........... G01R 1/0408
(Continued)

OTHER PUBLICATIONS

International Search Report and Written Opinion for International Application No. PCT/EP2020/086962 (13 pages) (Mar. 23, 2021).

*Primary Examiner* — Christopher P McAndrew
(74) *Attorney, Agent, or Firm* — Lucas & Mercanti, LLP

(57) ABSTRACT

A testing head for testing the functionality of an electronic device is disclosed having a plurality of contact probes including a probe body extended between respective end portions adapted to contact respective contact pads, a lower guide provided with guide holes for housing the contact probes, and a conductive portion in the lower guide. The conductive portion includes a group of the guide holes and is adapted to contact and short-circuit a corresponding group of contact probes housed in the group of holes. The contact probes housed in the group of holes include a deformable portion adapted to be partially inserted into the guide holes of the group. The deformable portion, when housed in the guide holes, is in a configuration in which it is deformed by the contact with a wall of the guide holes and exerts on the wall a reaction force ensuring a sliding contact during testing of the electronic device.

15 Claims, 4 Drawing Sheets

(58) Field of Classification Search
USPC .................................................. 324/754.03
See application file for complete search history.

(56) References Cited

U.S. PATENT DOCUMENTS

2014/0118016 A1   5/2014   Breinlinger et al.
2017/0122983 A1   5/2017   Acconcia et al.

FOREIGN PATENT DOCUMENTS

| TW | 201344200 A | 11/2013 | |
|----|----|----|----|
| TW | 201423112 A | 6/2014 | |
| WO | 2008100101 A1 | 8/2008 | |
| WO | 2016087369 A1 | 6/2016 | |
| WO | WO-2018108777 A1 * | 6/2018 | ............. G01R 1/067 |
| WO | WO-2018108790 A1 * | 6/2018 | ......... G01R 1/06772 |
| WO | WO-2018153963 A1 * | 8/2018 | ........... G01R 1/0483 |
| WO | WO-2019091946 A1 * | 5/2019 | ......... G01R 1/06738 |

* cited by examiner

TESTING HEAD WITH AN IMPROVED CONTACT BETWEEN CONTACT PROBES AND GUIDE HOLES

CROSS-REFERENCE TO RELATED APPLICATIONS

This application is a 371 of PCT/EP2020/086962, filed Dec. 18, 2020, which claims the benefit of Italian Patent Application No. 102019000024946, filed Dec. 20, 2019.

FIELD OF APPLICATION

The present invention relates to a testing head which is adapted to perform the test of electronic devices integrated on a semiconductor wafer, and the following description is made with reference to this application field with the only purpose of simplifying the exposition thereof.

BACKGROUND OF THE INVENTION

As it is well known, a testing head is essentially a device which is adapted to electrically connect a plurality of contact pads of a microstructure, in particular an electronic device integrated on a semiconductor wafer, with corresponding channels of a testing apparatus which performs the functionality testing thereof, particularly the electrical one, or generically the test.

The test performed on integrated circuits is useful in particular to detect and isolate defective circuits as early as in the production phase. Usually, the testing heads are thus used for the test of the circuits integrated on wafers before cutting and assembling them inside a chip containment package.

A testing head essentially comprises a plurality of movable contact probes retained by at least one pair of supports or guides which are substantially plate-like and parallel to each other. These plate-like supports are provided with suitable guide holes and are located at a distance from each other so as to create a free area or air gap for the movement and the possible deformation of the contact probes, which are normally formed by wires made of special alloys with good electrical and mechanical properties.

The contact probes generally extend between a first end portion, adapted to contact the contact pads of the device under test, and a second end portion, adapted to contact a space transformer or a printed circuit board (PCB) associated with the testing head.

The proper operation of a testing head is basically linked to two parameters: the vertical movement (or overtravel) of the contact probes and the horizontal movement (or scrub) of the contact tips of these probes on the contact pads. All these features are to be evaluated and calibrated in the manufacturing step of the testing head, and the good electrical connection between the contact probes and the device under test should always be ensured.

In a more and more increasing number of applications, for example in high-frequency applications, at least one of the guides of the testing head has a conductive portion (in particular a metallization) with the purpose of electrically connecting specific groups of contact probes to each other, forming a common conductive plane for these groups of probes. Thereby, it is possible to improve the frequency performances of the testing head and to carry with a low noise signals having a higher and higher frequency.

In order to achieve a good electrical connection between the contact probes and the conductive portion, a metallization of the walls of the guide holes housing the probes to be short-circuited is also generally provided. In this case, during the test of a device, the electrical connection between the contact probe and the conductive portion of the guide occurs via a sliding contact between the wall of the contact probe and the wall of the metallized guide hole.

However, it is known that it is often impossible to ensure an efficient electrical connection between the probe and the metallization, resulting in an unacceptable limitation of the overall performances of the testing head. In other words, it is not always possible to ensure an appropriate sliding contact between the contact probes and the walls of the guide holes, so that the frequency performances of the testing head are often limited.

The technical problem of the present invention is to provide a testing head having structural and functional features so as to allow overcoming the limitations and drawbacks of the known solutions, in particular which is able to ensure an optimum sliding contact between the contact probes and the walls of the guide holes housing them.

SUMMARY OF THE INVENTION

The solution idea underlying the present invention is to make a testing head having contact probes which are shaped so as to comprise an elastically deformable portion to be housed in a guide hole, in particular a portion which is apt to be elastically deformed by the wall of the guide hole of the lower guide in which it is housed. Thereby, during the deformation thereof caused by the contact against the wall of the guide hole, this elastically deformable portion exerts a reaction force against this wall, ensuring an optimum electrical and mechanical connection between the probe and the walls of the hole. In particular, due to the thrust exerted by the probe portion against the wall of the guide hole, the sliding contact with metallized walls of the guide hole is always ensured during the movement of the probe in the testing step, even in the presence of a movement of the guides.

Based on this solution idea, the above technical problem is solved by a testing head for testing the functionality of an electronic device, this testing head comprising a plurality of contact probes comprising a probe body longitudinally extended between respective end portions which are adapted to contact respective contact pads, at least one lower guide provided with guide holes for slidingly housing the contact probes, and a conductive portion in the lower guide, this conductive portion including at least one group of the guide holes and being adapted to contact and short-circuit a corresponding group of contact probes housed in this group of holes and adapted to carry a certain type of signal, characterized in that at least the contact probes housed in this group of holes comprise an elastically deformable portion which is adapted to be at least partially inserted into the guide holes of this group, wherein this portion, when housed in the guide holes of this group, is in a configuration in which it is deformed by the contact with at least one wall of the guide holes and it exerts on this wall a reaction force ensuring the sliding contact during the test of the electronic device.

More in particular, the invention comprises the following additional and optional features, taken individually or in combination if required.

According to an aspect of the present invention, the at least one conductive portion can cover at least one portion of at least one wall of the guide holes of this group of holes, forming a metallized portion of these holes which the elastically deformable portion is adapted to contact.

In an embodiment, the entire wall of the guide holes can be covered by the conductive portion.

According to an aspect of the present invention, the testing head can further comprise an upper guide separated from the lower guide by an air gap and provided with respective guide holes, wherein the conductive portion and the elastically deformable portion are arranged only at the lower guide, which is the guide being closest to the device under test, or are arranged at both these guides.

According to an aspect of the present invention, the lower guide and the upper guide can be shifted from each other, resulting in an offset of the first end portion of each contact probe with respect to the second end portion.

According to another aspect of the present invention, the testing head can also comprise contact probes without the elastically deformable portion.

According to another aspect of the present invention, the conductive portion can be configured to form a common conductive plane for one of a ground domain, a power domain or a set of contact probes carrying a same operating signal.

According to another aspect of the present invention, the probe body of the contact probes can comprise, at the elastically deformable portion, a through cut which separates different portions of this probe body from each other and defines the shape of this portion.

In an embodiment, the cut can extend in at least two directions which are different from each other and can define the elastically deformable portion in the form of a strip, which is connected to the probe body at a connection zone and is separated from the rest of the probe body by this cut, this strip being adapted to contact the wall of the guide holes when it is housed therein and being configured to be elastically deformed and exert on this wall the reaction force.

According to another aspect of the present invention, the elastically deformable strip comprises a curved section with respect to the longitudinal axis thereof.

According to another aspect of the present invention, in the deformed configuration when the contact probes are housed in the guide holes of the lower guide, the deformation of the elastically deformable portion can result in a reduction of the cut area with respect to the configuration in which these contact probes are not housed in the guide holes of the lower guide.

Furthermore, the elastically deformable portion can extend longitudinally, i.e. along the longitudinal axis of the probe body, along a length which is at least equal to the thickness of the lower guide.

According to another aspect of the present invention, in the configuration in which the contact probes are not housed in the guide holes, the probe body at at least one section of the elastically deformable portion can have a maximum transversal extension which is greater than the width of the guide holes of the lower guide, i.e. this elastically deformable portion transversely extends more than the rest of the probe body.

According to still another aspect of the present invention, the end portion of the contact probes can comprise a bevelled portion, this end portion being adapted to contact contact pads of the device under test. In particular, this bevelled portion is at an edge facing the strip.

According to still another aspect of the present invention, the contact probes can be of the buckling beam type, wherein the probe body has a deformation.

According to still another aspect of the present invention, the conductive portion can be arranged on a face of the guide.

Finally, the conductive portion can be in the form of a plurality of metallizations, which are electrically insulated from each other and are configured to form a plurality of conductive portions for the contact probes.

The features and advantages of the testing head according to the invention will become apparent from the following description of an embodiment thereof, given by way of non-limiting example with reference to the accompanying drawings.

DETAILED DESCRIPTION

Figure 1:
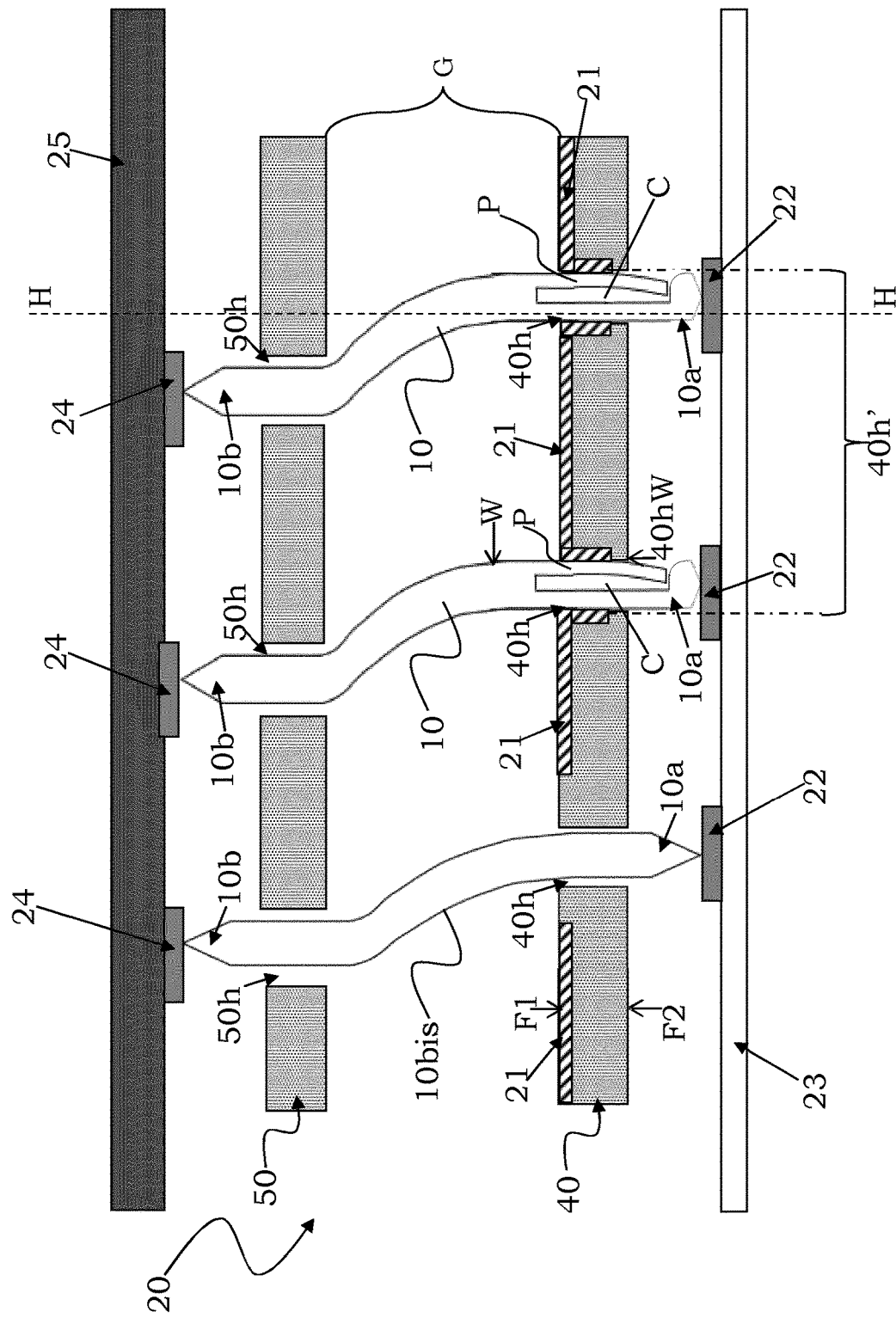
FIG. 1 schematically shows a testing head according to the present invention.

With reference to these figures, and in particular to the example of FIG. 1, a testing head according to the present invention is globally and schematically indicated with 20.

It is worth noting that the figures represent schematic views and are not drawn to scale, but instead they are drawn so as to emphasize the important features of the invention. Moreover, in the figures, the different elements are depicted in a schematic manner, their shape varying depending on the application desired. It is also noted that in the figures the same reference numbers refer to elements that are identical in shape or function. Finally, particular features described in relation to an embodiment illustrated in a figure are also applicable to the other embodiments illustrated in the other figures.

The testing head 20 is adapted to connect with an apparatus (not illustrated in the figures) to perform the test of electronic devices which are integrated on a semiconductor wafer 23, for example high-frequency devices.

The testing head 20 comprises a plurality of contact probes 10 slidingly housed in the testing head and intended to connect the device under test integrated on the semiconductor wafer 23 with the testing apparatus. In order to house the contact probes 10, the testing head 20 comprises at least one guide 40 provided with guide holes 40h through which the contact probes 10 are able to slide.

Each contact probe 10 comprises a probe body 10' which extends along a longitudinal axis H-H between a first end portion 10a and a second end portion 10b, which are adapted to contact respective contact pads. By way of example, the first end portion 10a (also called contact tip) is adapted to contact contact pads 22 of the device under test integrated on the semiconductor wafer 23, while the second end portion 10b (also called contact head) is adapted to contact contact pads 24 of a space transformer or of a printed circuit board (PCB), this component being identified with the numeral reference 25. Clearly, although the end portions 10a and 10b in the attached figures end with a pointed shape, they are not limited thereto and may have any shape which is suited to the needs and/or circumstances.

The guide 40 is a lower guide and thus, as it is known in the art, it is the guide being closest to the first end portion 10a intended to contact the device under test.

The probe body 10' has preferably a square or rectangular cross section (i.e. it is preferably rod-like), but the present invention is not limited thereto. For example, the probe body 10' can also have a circular section, or any other section suited to the needs and/or circumstances. In any case, the probe body 10' has at least one wall W, whose surface can be flat (for example in the case of a probe having a square or rectangular section) or curvilinear (for example in the case of a probe having a circular section), this wall being adapted to be in contact with a respective wall of a guide hole.

According to the present invention, the contact probe 10 is a probe of the type which is known in the art as "buckling beam", i.e. it has a constant cross section for the whole length thereof, preferably a square or rectangular one, wherein the probe body 10' has a deformation in a substantially central position and is adapted to bend and thus to further deform during the test of the device under test.

As it will be described hereafter, the deformation of the probe body 10' is generally achieved by a so-called shifted-plate guide configuration of the testing head 20, wherein a pair of guides is first overlapped so as to align the respective guide holes. Afterwards, once the contact probes 10 have been inserted into these guide holes, the guides are spaced apart, forming an air gap therebetween, and then they are shifted, causing the above deformation of the probe body 10'.

In this case, the contact probe 10 is apt to further bend during the contact with the pads 22 of the device under test, this bending determining the lateral displacement of the probe in a certain direction, herein indicated as bending direction. In particular, the relative shift of the guides determines the bending direction of the contact probe 10 and thus the movement direction of the related end portions. This movement causes at least one first wall of the contact probe 10 to contact a corresponding wall of a guide hole, a clearance being defined between a second wall of the contact probe 10 and an opposite wall of the guide hole, or both the opposite walls of the contact probe 10 may contact the corresponding opposite walls of the guide holes. In other words, during the bending, one or more walls W of the probe (in particular the two walls being opposite to each other along the bending direction) contact the walls of the guide holes in which the contact probe 10 is housed.

Furthermore, during the bending of the contact probes 10 (in particular during the vertical movement of the probes, indicated in the art as overtravel), a sliding contact occurs between the probe body 10' and the guide hole wall.

The probe body 10' thus comprises a portion P which is adapted to be inserted at least partially into a guide hole 40h of the lower guide 40 of the testing head 20 and, during the movement of the contact probe 10, this portion P performs a contact with this guide hole 40h, in particular a sliding contact.

It is known in the art that the fixed position of the power and ground signals (due to the layout of the pads of the device under test) and the probe shape limit the control of the impedance of the signals inside the testing head, as well as they limit the control of the noise caused on the signal probes by other close signals, which limits the frequency performances of the testing head.

For this reason, in high-frequency applications (in particular RF applications), the ground probes (and also the power ones) are short-circuited by means of a metallization on the guide, in particular by short-circuiting probes of a same domain and making the ground contact available inside the testing head to connect possible shields. Moreover, in the case of devices having several ground/power supply domains on the device which are then joined on the PCB, the metallization allows the loop inductance between a power supply and the related ground to be reduced.

For example, consider the case in which a given power supply of a device under test is contacted by a single probe of the head, which is short-circuited with other probes which carry power signals sharing the same power supply. In this case, when the current of this power signal meets the metallization which short-circuits all the probes of this domain, it splits among all the short-circuited probes thereby allowing the inductance and equivalent resistance to be reduced compared to the case in which this current is confined in a single probe up to the PCB.

It is thus evident that the presence of metallizations or conductive portions on the guide, which metallizations short-circuit groups of probes and create a common conductive plane, allows the noise to be reduced and the frequency performances of the testing head to be increased.

For this purpose, in accordance with the present invention, the lower guide 40 of the testing head 20 illustrated in FIG. 1 comprises at least one conductive portion 21 which includes and electrically connects the holes of at least one group (indicated with the reference 40h') of the guide holes 40h to each other, and which is adapted to contact, and thus to short-circuit, a corresponding group of contact probes, which are adapted to carry a same type of signal, in particular intended to carry a determined ground or power or operating signal domain.

For example, the contact probes 10 that are short-circuited with each other by the conductive portion 21 can be contact probes adapted to carry ground signals, as well as they can be contact probes adapted to carry power signals. In other words, in the testing head 20, the contact probes that are short-circuited with each other due to the metallization of the lower guide 40 and housed in the group 40h' of the guide holes 40h are adapted to carry a same either ground or power signal, with a subsequent increase in the testing head performances.

Furthermore, as mentioned above, the short-circuited probes can also be contact probes adapted to carry input/output operating signals between the device under test and the testing apparatus interfaced with the testing head 20, as it occurs for example in the loop-back technique. In any case, the conductive portion 21 is such as to form a common conductive plane in the testing head.

Obviously, the testing head 20 can comprise any number of conductive portions 21 arranged in any way on the guide or even embedded therein, for carrying any type of signal. For example, the conductive portion can be arranged on an upper face F1 of the guide 40 (as shown in FIG. 1), as well as on a lower face F2 thereof, as well as it can be formed inside said guide.

Moreover, it is possible to provide the presence of a first conductive portion which short-circuits ground probes and a second conductive portion which short-circuits power probes arranged on an opposite face of the guide or even on another guide (such as for example an intermediate guide or a further lower/upper guide not illustrated in the figures), as well as many other configurations can be provided, as described for example in the PCT patent application no. PCT/EP2017/082180 in the name of the Applicant. The manufacturing method of this conductive portion is not limited to a particular one, for example it can be formed by depositing conductive material on the ceramic guide.

In other words, the present invention is not limited by the number and arrangement of the conductive portions, which can be set based on the needs and/or circumstances.

In any case, what matters is that the presence of the at least one conductive portion 21 allows a common conductive plane to be formed, which plane electrically connects several contact probes to each other (i.e. the contact probes 10 housed in the group of holes 40$h$') and is able to increase the overall performances of the testing head 20, as indicated above.

Furthermore, the conductive portion 21 covers at least one portion of the walls 40$h$W of the guide holes of the group 40$h$', thereby forming a metallized portion of the guide hole, which is contacted by the contact probe 10, in particular with which the contact probe 10 makes the abovementioned sliding contact.

Preferably, the conductive portion 21 can entirely cover some or all the walls of the guide holes (and thus in this case the metallized portion coincides with the entire wall 40$h$W of the holes), or it is possible to provide a configuration in which this conductive portion 21 only partially covers the wall 40$h$W of the guide holes.

Given the importance of the conductive portion 21, there is thus the need to ensure an optimum contact between the contact probes 10 and this conductive portion 21 (specifically between the probes and the metallized walls of the guide holes) during the test of the device, in particular there is the need to always ensure the abovementioned sliding contact between the probe and the hole.

Figure 2:
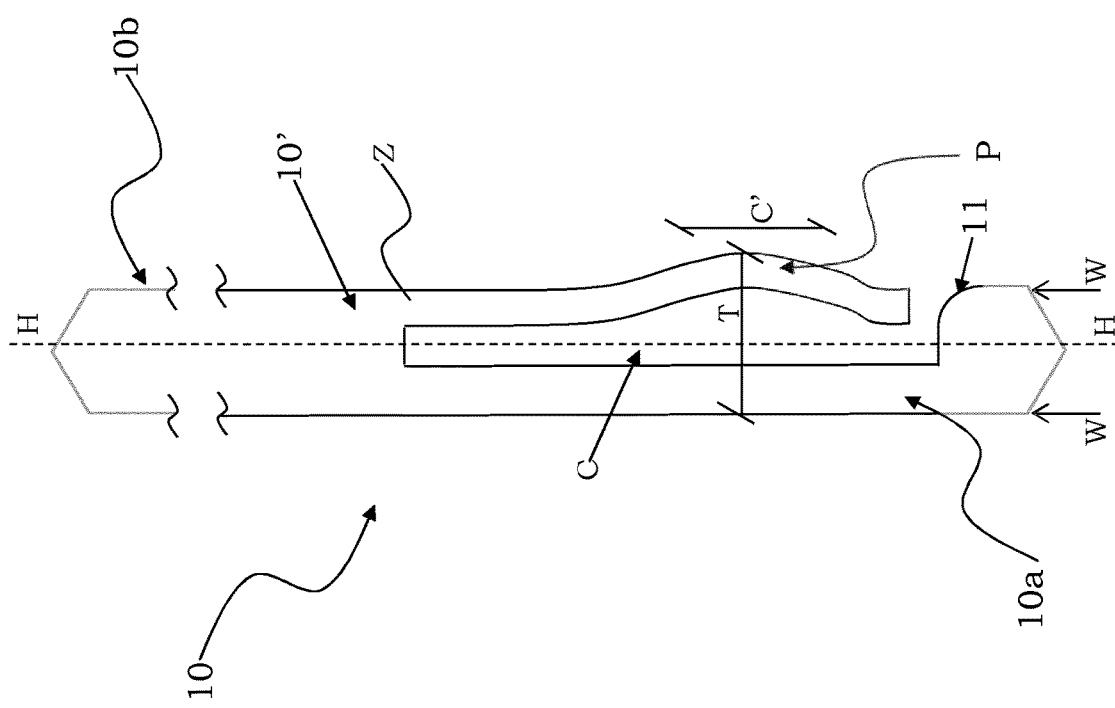
FIG. 2 schematically shows a contact probe of the testing head according to the present invention in a first configuration.
Figure 3:
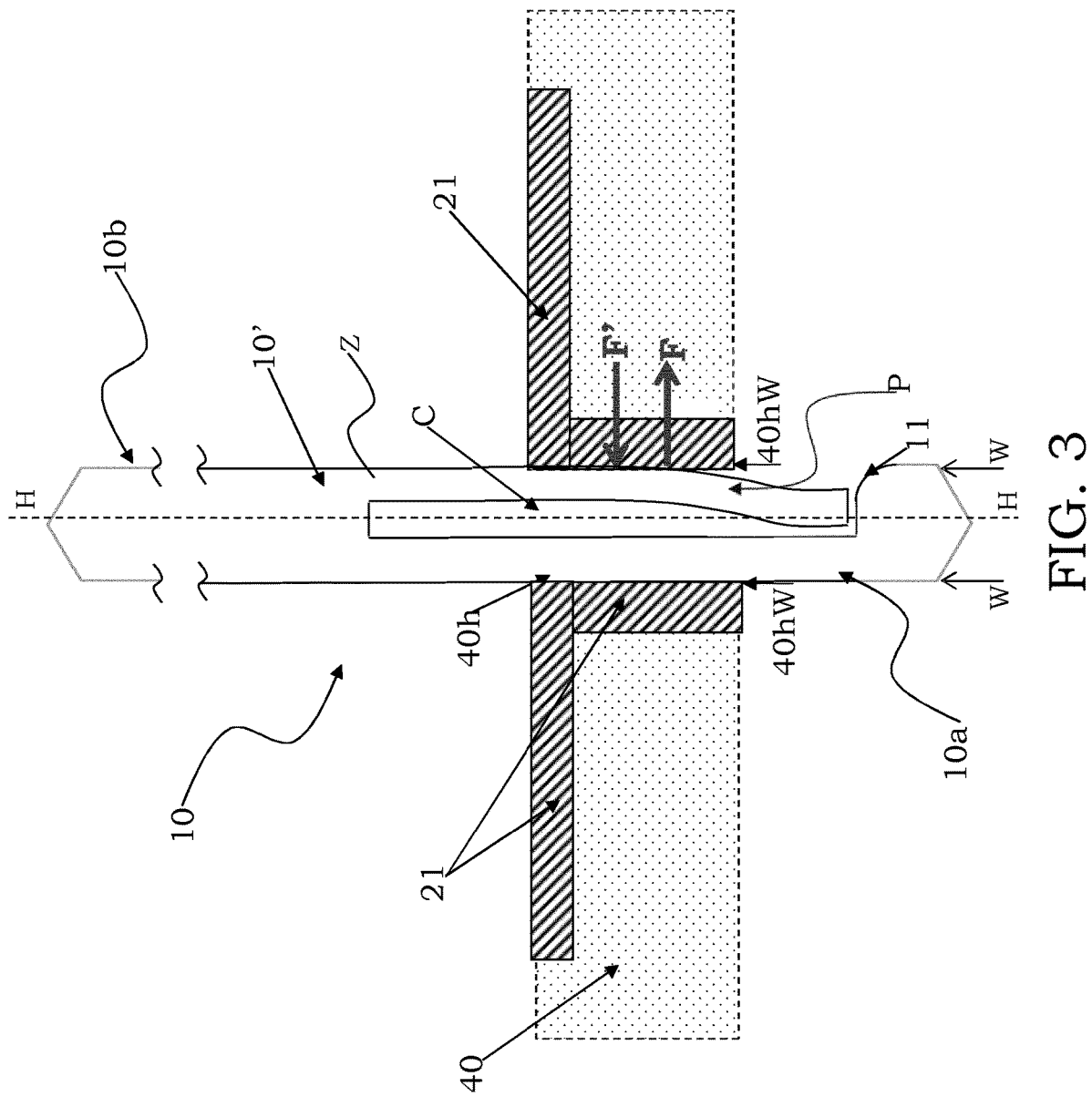
FIG. 3 schematically shows a contact probe of the testing head according to the present invention in a second configuration, in which an elastically deformable portion thereof is deformed by the contact with a wall of a guide hole in which the probe is housed.

As better illustrated in FIGS. 2 and 3, advantageously according to the present invention, in order to improve the electrical contact between the contact probes 10 and the conductive portion 21, the portion P inserted into the guide hole 40$h$ of the lower guide 40 is adapted to be elastically deformed due to the contact with a wall 40$h$W of the guide hole 40$h$, this portion P being configured to exert against this wall 40$h$W a reaction force in response to this deformation, this elastic reaction force being indicated in FIG. 3 by the arrow F.

As it can be seen from the comparison between FIGS. 2 and 3, the elastically deformable portion P is thus adapted to switch from a first configuration, in which it is at rest and not deformed (for example when the probe is not inserted into the guide hole, FIG. 2), to a second configuration, in which this portion P is deformed by the contact with the wall 40$h$W of the guide hole 40$h$ and it exerts on this wall 40$h$W the reaction force F (FIG. 3).

In other words, according to another point of view, the wall 40$h$W of the guide hole 40$h$ exerts on the portion P of the contact probe 10 a force F' which deforms this portion elastically, this portion P exerting the thrust force F against this wall 40$h$W in reaction thereto. This contact between the probe and the wall of the guide hole thus determines a movement of the elastically deformable portion P from the balance position thereof (i.e. from the position in which it is not inserted into the guide hole), generating this reaction force F.

In this wat, as a reaction to the undergone deformation, the portion P, due to its elasticity, is such as to exert a thrust against the wall 40$h$W of the guide hole 40$h$ and to ensure an optimum sliding contact between the probe and the hole.

The force F can have several values depending on the configurations, for example it can be about 0.01 N (generally <1 g).

It is thus evident that the presence of the elastically deformable portion P allows the quality of the sliding contact between the contact probe 10 and the metallized wall 40$h$W of the guide hole 40$h$ to be improved, solving the problems reported in relation to the prior art. In fact, due to the deformation, the portion P exerts on this wall the force F such that the sliding during bending of the probes is always optimally ensured.

Preferably, the elastically deformable portion P is arranged in close proximity to the first end portion 10$a$ of the contact probe 10, i.e., when the contact probe is housed in the testing head 20, it is at the lower guide 40. As indicated above, the first end portion 10$a$ is the probe portion which is adapted to contact the pads of the device under test and, in the context of the present invention, it is thus the probe portion being closest to the device under test during the normal operation of the testing head 20. In other words, the person skilled in the art certainly appreciates that the term first end portion 10$a$ means the probe portion being closest to the device under test, ending with the contact tip, and also comprising a probe part possibly housed in the lower guide 40.

In an advantageous and preferred embodiment of the present invention, the probe body 10' comprises a through cut C which separates different portions of this probe body 10' from each other and thereby defines the elastically deformable portion P, in particular it defines the shape thereof.

More particularly, as better represented in the embodiment of FIGS. 2 and 3, the cut C extends along at least two directions which are different from each other, in such a way that the portion P is in the form of a strip or arm (always indicated with the reference P) which extends from the probe body 10'. This strip is connected to the probe body 10' at a connection zone Z and, as indicated above, is separated from the rest of the probe body 10' by the cut C.

Thereby, as shown in FIG. 3, the elastically deformable strip P is suitably configured to contact the wall 40$h$W of the guide hole 40$h$ during the movement of the probe and it is deformed by the contact with this wall 40$h$W. In particular, the strip is bent inwards of the probe body 10' and, following this deformation, it exerts the reaction force F against the wall 40$h$W of the guide hole 40$h$ which ensures the optimum sliding contact during the test.

In an embodiment of the present invention, the elastically deformable strip comprises a curved section, identified with the reference C', with respect to a longitudinal axis thereof (always indicated with the reference H-H).

In this way, in an embodiment, as it can be seen in FIG. 2, the curved section C' is the section which projects from the probe body 10' and which is bent inwards of the probe body once the probe is introduced into the guide hole, forming the desired mechanical interference and generating the above force.

By way of example, the cut C can be made by laser cutting of a conductive substrate, moving the focused laser beam along at least two different directions to define the strip P and thus the cut area which separates the strip from the rest of the probe body 10'. Obviously, also other manufacturing methods are possible.

In general, in the configuration in which the contact probes 10 are not housed in the guide holes 40$h$, the probe body 10' at at least one section of said elastically deformable portion P has a maximum transversal extension T (measured along an axis which is orthogonal to the axis H-H) which is greater than the width of the guide holes 40h of the lower guide 40. In other words, the elastically deformable portion P transversely extends more than the rest of the probe body 10', so that the probe has maximum transversal dimensions being greater than those of the guide holes at the deformable portion P inserted into these guide holes.

As mentioned above, when the deformable portion P has the shape of a strip provided with the curved section C', then this strip transversely extends more than the rest of the probe body, in particular at this curved section C'.

In order to facilitate the insertion and extraction of the probes in the holes of the lower guide 40, the end portion 10a of the contact probes comprises a bevelled portion 11, in particular at the edge facing the arm P. In other words, the bevelled portion 11 faces the cut area and is formed by removing some material from the end of the probe when the strip P is formed.

Furthermore, when the contact probe 10 is at rest in the first configuration, the strip-shaped portion P can extend longitudinally, i.e. along the longitudinal axis H-H of the probe body 10', along a length which is at least equal to the thickness of the guide 40, preferably greater. Depending on the configurations, this length can vary from 100 μm to 1000 μm.

Obviously, the above-indicated values are only exemplary values and are not limiting of the scope of the present invention.

The presence of a strip acting as elastically deformable portion is particularly advantageous since it is thereby easy to achieve a deformation thereof with respect to the balance condition, and thus to achieve the generation of the reaction force F tending to push this strip against the hole wall. In this way, it is easy to form at the lower guide this retaining portion which, by pushing outwards of the probe body, ensures the desired sliding contact.

However it is observed that, although the above-outlined configuration is the preferred one, other different configurations may be adopted, where what matters is that the probe comprises an elastically deformable portion P which is adapted to exert a force against the wall of the guide hole, in response to the deformation thereof.

Figure 4B:
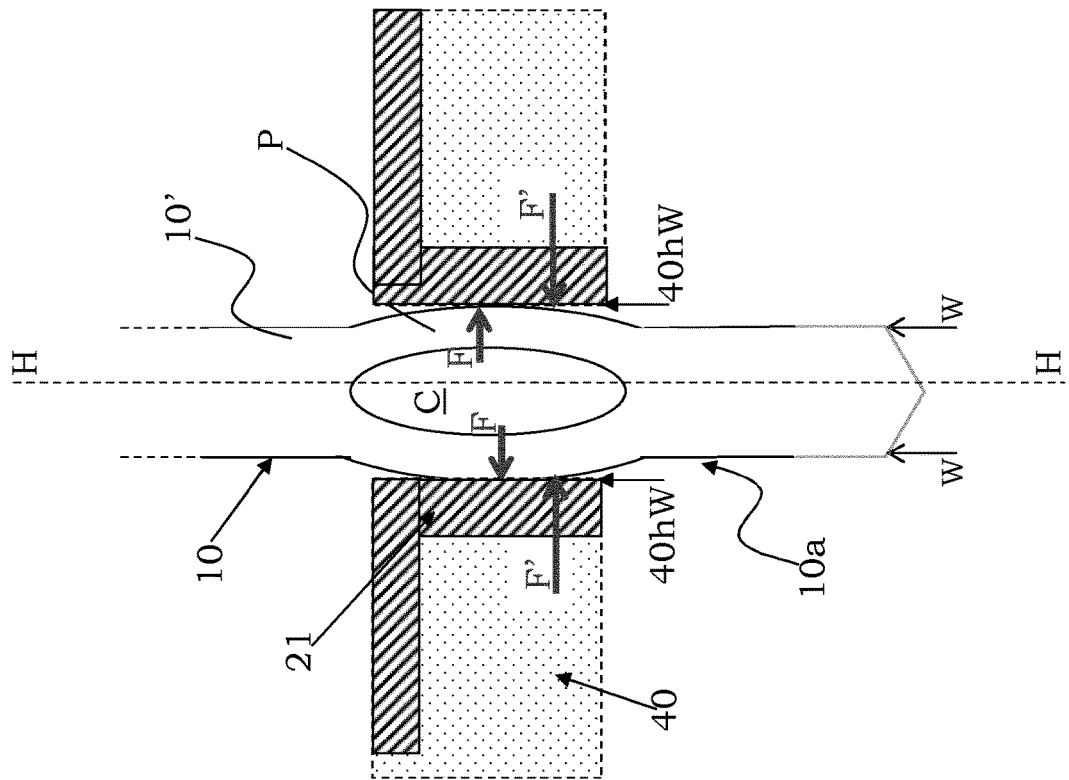
FIGS. 4A and 4B show a contact probe of a testing head according to an alternative embodiment in two different configurations.
Figure 4A:
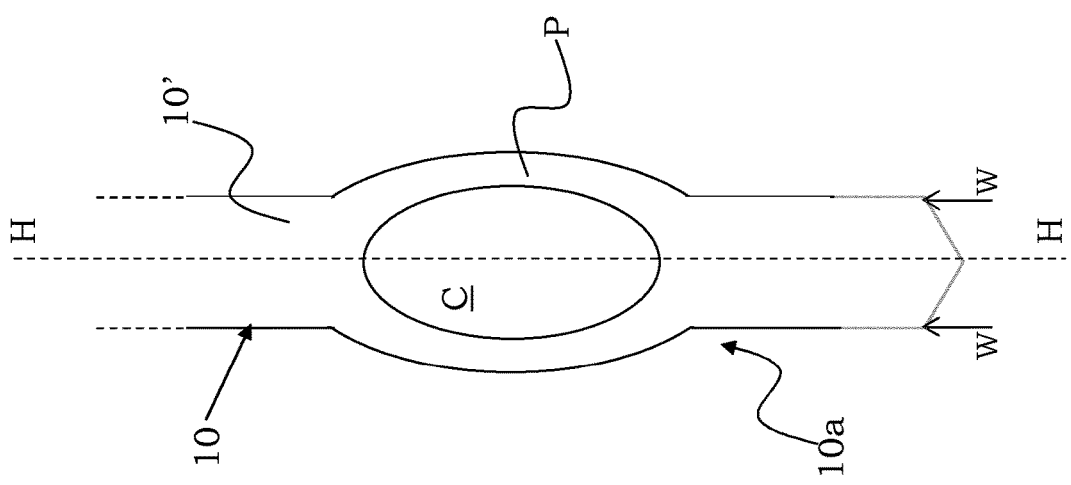

For example, in an alternative embodiment of the present invention (illustrated in FIGS. 4A and 4B), the cut C can extend along a single direction, for example which is parallel to the longitudinal axis H-H of the probe body 10', preferably in a substantially central position of this probe body 10', and the portion P is in the form of a slot in said probe body 10'. In this case, the slot-shaped elastically deformable portion P transversely extends more than the rest of the probe body, in such a way that when the contact probe 10 is inserted into the guide holes of the lower guide 40, this slot is subjected to a compressive force F' against opposite walls 40hW of the guide hole 40h and it exerts a reaction force F on these walls. Also this embodiment is thus able to ensure an optimum sliding contact between the probe and the walls of the guide hole of the lower guide 40.

In general, in according to the present invention, in the second configuration in which the contact probe 10 is housed in the guide hole 40h and the elastically deformable portion P is deformed by the contact with the wall 40hW, the deformation of this portion P results in a reduction of the area of the cut C. More particularly, the strip is pushed towards the centre of the probe body 10', reducing the cut area while the shape thereof is modified by the sliding contact, as shown in FIGS. 2 and 3 and in FIGS. 4A and 4B.

The elastically deformable portion P is thus suitably formed in an area of the probe body 10' which is adapted to be inserted into a guide hole 40h, at the lower guide 40 where the sliding contact between the probe and the hole occurs, and thus at the probe end being closest to the device under test. This embodiment is particularly advantageous since it is preferable to short-circuit the probes as close to the device under test as possible, in order to achieve the best frequency performances. Due to the above positioning, the elastically deformable portion P is at a wall W of the probe body 10' intended to slide against a corresponding wall 40hW of a guide hole during the bending of the probes, this bending occurring during the contact of the probe with the pads of the device under test.

Still referring to FIG. 1, in an embodiment, the testing head 20 also comprises an upper guide 50 separated from the lower guide 40 by an air gap G, this upper guide 50 being suitably offset or shifted from the lower guide 40 (i.e. the guide holes are shifted from each other) in order to form the deformation of the probe body 10', as indicated above. The upper guide 50 comprises a plurality of guide holes 50h intended to slidingly house the contact probes. In the non-limiting example of FIG. 1, the testing head 20 is a vertical probe head, wherein the first end portion 10a of the probes is adapted to contact the contact pads 22 of the device under test integrated on the conductor wafer 23, while the second end portion 10b is adapted to contact the contact pads 24 of a space transformer or a PCB 25 associated with the testing head 20.

Although it is preferred to form the conductive portion 21 on the lower guide 40 for the above-indicated reasons, nothing prevents the deformable portion from being formed also on the upper guide, for example to improve the retention of the contact probe, and it is also possible to form conductive portions on this upper guide as well, should the circumstances require it.

Finally, in its more general form, the testing head 20 comprises both contact probes provided with the elastically deformable portion P, and traditional contact probes without this elastically deformable portion P (these probes are herein indicated as probes 10bis), for example contact probes which are not to be short-circuited and thus which are not to be electrically connected to a conductive portion.

In conclusion, the present invention provides a testing head having contact probes shaped so as to comprise an elastically deformable portion to be housed in a guide hole, in particular a portion which is adapted to be elastically deformed by the wall of the guide hole of the lower guide in which it is housed. Thereby, during the deformation thereof caused by the contact against the wall of the guide hole, this elastically deformable portion exerts a reaction force against this wall, ensuring an optimum electrical and mechanical connection between the probe and the walls of the hole. In particular, due to the thrust exerted by the probe portion against the wall of the guide hole, the sliding contact with the metallized walls of this guide hole is always ensured during the movement of the probe in the testing step, even in the presence of a movement of the guides.

Advantageously according to the present invention, the presence of the elastically deformable portion is able to always ensure an optimum sliding contact between a contact probe and a metallized hole of the guide, in particular during the movement and the bending of the contact probes caused by the pressure of the ends thereof against the pads of the device under test during the test, thereby overcoming all the problems of known solutions. The quality of this contact between the probe and the metallization of the hole wall is thus considerably increased due to the thrust exerted by the deformed portion against this wall, this thrust increasing the contact pressure and thus the quality of this contact. In other words, the sliding contact is always ensured increasing the overall performances of the testing head.

Moreover, the thrust exerted by the probe during the deformation allows an optimum electrical and mechanical contact to be always preserved during the test of the device even in the presence of movements of the guides.

Thereby, suitably according to the present invention, it is possible to efficiently short-circuit groups of contact probes through conductive plates on the guides, so as to improve the frequency performances of the testing head which houses these probes.

It is thus evident that the testing head of the present invention is particularly suited to the test of high-frequency devices, also in the radiofrequency domain.

Obviously, a person skilled in the art, in order to meet particular needs and specifications, can carry out several changes and modifications to the testing head described above, all included in the protection scope of the invention as defined by the following claims.

The invention claimed is:

1. A testing head for testing the functionality of an electronic device, the testing head comprising:
    a plurality of contact probes comprising a probe body extended longitudinally between a first end portion and a second end portion which are adapted to contact respective contact pads;
    a lower guide provided with guide holes for the sliding housing of the contact probes; and
    a conductive portion in the lower guide, the conductive portion including a group of the guide holes and being adapted to contact and short-circuit a corresponding group of contact probes which are housed in said group of holes and are adapted to carry a certain type of signal,
    wherein the contact probes housed in said group of holes comprise an elastically deformable portion adapted to be inserted at least partially into the guide holes of said group, wherein the elastically deformable portion, when housed in the guide holes of said group, is in a configuration in which it is deformed by the contact a wall of the guide holes and, in reaction to said deformation, exerts on the wall a reaction force, said reaction force being a thrust of said deformable portion against the wall, ensuring a sliding contact during the test of the electronic device, the sliding contact being a contact between the probe body and the wall of the guide holes of the lower guide during the overtravel of the contact probes,
    wherein the conductive portion covers a portion of the wall of the guide holes of said group of holes, forming a metallized portion of the holes which the elastically deformable portion is adapted to contact, and
    wherein the elastically deformable portion is located at the lower guide, thereby being closer to the first end portion than to the second end portion and being adapted to contact the metalized portion of the guide holes of said group of holes of the lower guide.

2. The testing head according to claim 1, wherein the entire wall of the holes is covered by the conductive portion.

3. The testing head according to claim 1, further comprising an upper guide separated from the lower guide by an air gap and provided with respective guide holes, wherein the conductive portion and the elastically deformable portion are arranged only at the lower guide, which is the guide closest to the device under test, or are arranged at both guides.

4. The testing head according to claim 3, wherein the lower guide and the upper guide are shifted from each other, resulting in an offset of the first end portion of each contact probe with respect to the second end portion.

5. The testing head according to claim 1, also comprising contact probes without the elastically deformable portion.

6. The testing head according to claim 1, wherein the at least one conductive portion is configured to form a common conductive plane for one of a ground domain, a power domain, or for a set of contact probes carrying a same operating signal.

7. The testing head according to claim 1, wherein the probe body of the contact probes comprises, at the elastically deformable portion, a through cut which separates different portions of the probe body from each other and defines the shape of the elastically deformable portion.

8. The testing head according to claim 7, wherein the cut extends at least along two different directions and defines the elastically deformable portion in the form of a strip, which is connected to the probe body at a connection zone and is separated from the rest of the probe body by the cut, the strip being adapted to contact the wall of the guide holes when it is housed therein and being configured to be elastically deformed and to exert on the wall the reaction force.

9. The testing head according to claim 8, wherein the elastically deformable strip comprises a curved section with respect to the longitudinal axis thereof.

10. The testing head according to claim 7, wherein, in the deformed configuration when the contact probes are housed in the holes of the lower guide, the deformation of the elastically deformable portion results in a reduction of the area of the cut with respect to the configuration in which the contact probes are not housed in the holes of the lower guide.

11. The testing head according to claim 1, wherein the elastically deformable portion extends longitudinally along a length at least equal to the thickness of the lower guide.

12. The testing head according to claim 1, wherein, in the configuration in which the contact probes are not housed in the guide holes, the probe body at a section of the elastically deformable portion has a maximum transversal extension greater than the width of the guide holes of the lower guide.

13. The testing head according to claim 1, wherein the first end portion of the contact probes comprises a beveled portion, the first end portion being adapted to contact pads of the device under test.

14. The testing head according to claim 1, wherein the conductive portion is arranged on one face of the lower guide.

15. The testing head according to claim 1, wherein the conductive portion is in the form of a plurality of metallizations, which are electrically insulated from each other and are configured to form a plurality of conductive portions for the contact probes.

* * * * *